(12) United States Patent
Kim et al.

(10) Patent No.: US 8,697,535 B2
(45) Date of Patent: Apr. 15, 2014

(54) THIN FILM TRANSISTOR SUBSTRATE AND METHOD FOR FABRICATING THE SAME

(75) Inventors: Tae-Jin Kim, Yongin (KR); Sang-Jae Yeo, Yongin (KR); Dae-Sung Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 102 days.

(21) Appl. No.: 13/328,094

(22) Filed: Dec. 16, 2011

(65) Prior Publication Data
US 2013/0043479 A1 Feb. 21, 2013

(30) Foreign Application Priority Data
Aug. 17, 2011 (KR) .................. 10-2011-0081738

(51) Int. Cl.
*H01L 21/76* (2006.01)

(52) U.S. Cl.
USPC ............... 438/421; 257/60; 257/E21.627

(58) Field of Classification Search
USPC ............. 257/522, 621, E21.627, E21.641, 257/E21.618; 438/421, 101; 359/248
See application file for complete search history.

(56) References Cited

U.S. PATENT DOCUMENTS

| | | | | |
|---|---|---|---|---|
| 5,567,958 A | * | 10/1996 | Orlowski et al. | 257/66 |
| 2007/0293045 A1 | * | 12/2007 | Youn et al. | 438/689 |

FOREIGN PATENT DOCUMENTS

| | | | | |
|---|---|---|---|---|
| KR | 10-1994-0024484 | | 11/1994 | |
| KR | 10-2001-0001454 A | | 1/2001 | |
| KR | 10-2008-0048620 A | * | 6/2006 | ........... H01L 29/786 |
| KR | 10-2006-0119211 A | | 11/2006 | |
| KR | 10-2008-0095739 A | | 10/2008 | |

* cited by examiner

*Primary Examiner* — Caridad Everhart
(74) *Attorney, Agent, or Firm* — Lee & Morse, P.C.

(57) ABSTRACT

A thin film transistor substrate includes a substrate, a gate electrode on the substrate, an active layer on or below the gate electrode (the active layer at least partially overlapping the gate electrode) including a first active region and a second active region, the first active region and the second active region facing each other and extending beyond the gate electrode, a source electrode electrically connected to the first active region and a drain electrode electrically connected to the second active region, wherein the active layer includes a recess region which is at least partially recessed from a surface of the active layer facing the gate electrode, and the recess region includes a portion extending between the first active region and the second active region.

17 Claims, 12 Drawing Sheets

THIN FILM TRANSISTOR SUBSTRATE AND METHOD FOR FABRICATING THE SAME

CROSS-REFERENCE TO RELATED APPLICATION

This application claims priority from Korean Patent Application No. 10-2011-0081738 filed on Aug. 17, 2011 in the Korean Intellectual Property Office, and all the benefits accruing therefrom under 35 U.S.C. 119, the contents of which in its entirety are herein incorporated by reference.

BACKGROUND

1. Field

The embodiments relate to a thin film transistor substrate and a method for fabricating the same.

2. Description of the Related Art

A thin film transistor substrate is used as a substrate of an active liquid crystal display, an active organic electro luminescence (EL) display or the like which actively displays an image for each of pixels arranged in a matrix.

The liquid crystal display uses a thin film transistor as a switching device for controlling an image signal being transmitted to an electrode. The organic electro luminescence (EL) display includes a driving thin film transistor and a switching thin film transistor which supply current for light emission to each pixel.

The thin film transistor substrate includes a plurality of gate lines and data lines arranged horizontally and vertically to define a plurality of pixel regions, thin film transistors as switching devices formed at intersections of the gate lines and the data lines, and pixel electrodes formed in the pixel regions.

In an active layer of the thin film transistor, if an ON voltage equal to or greater than a threshold voltage is applied to a gate electrode, a channel is formed, and, if an OFF voltage is applied to the gate electrode, the channel vanishes to cut off the current between the source electrode and the drain electrode.

A high ON voltage is applied to the gate electrode in order to sufficiently form a channel between the source electrode and the drain electrode, and a high OFF voltage is applied to the gate electrode in order to completely extinguish the formed channel. If a high ON voltage is not applied to the gate electrode, the channel is not sufficiently formed such that the current does not flow smoothly. If a high OFF voltage is not applied to the gate electrode, leakage current is generated.

SUMMARY

One or more embodiments may provide a thin film transistor substrate including: a substrate; a gate electrode on the substrate; an active layer on or below the gate electrode, the active layer at least partially overlapping the gate electrode, the active layer including a first active region and a second active region, the first active region and the second active region facing each other and extending beyond the gate electrode; a source electrode electrically connected to the first active region; and a drain electrode electrically connected to the second active region, wherein the active layer includes at least one recess region which is at least partially recessed from a surface of the active layer facing the gate electrode, and the recess region includes a portion extending between the first active region and the second active region. The recess region may include a through hole passing through the active layer.

The through hole may include two or more sub-through holes, formed by partially blocking an inner portion of the through hole. At least one of the two or more sub-through holes may be at an outermost portion of the active layer and may include an open end adjacent to the source electrode or the drain electrode. All of the sub-through holes may be located at the outermost portion and may have open ends adjacent to the source electrode or the drain electrode. The through hole may have one open end adjacent to the source electrode or the drain electrode. The recess region may include a groove extending vertically within the active layer. The recess region may include a through hole passing through the active layer and a groove extending vertically within the active layer. The gate electrode may at least be partially inserted into the recess region.

The gate electrode may be formed on the active layer. The thin film transistor substrate may further include a gate insulating film for insulation and protection of the gate electrode, wherein the gate electrode covers and surrounds a part of outer side surfaces of the active layer in non-contact with a line extending in a direction of the source electrode and the drain electrode, and the gate insulating film is interposed between the gate electrode and the active layer. The gate electrode may be formed below the active layer.

The thin film transistor substrate may further include a gate insulating film for insulation and protection of the gate electrode, wherein the gate electrode covers and surrounds a part of outer side surfaces of the active layer in non-contact with a line extending in a direction of the source electrode and the drain electrode, and the gate insulating film is interposed between the gate electrode and the active layer.

One or more embodiments may provide a thin film transistor substrate including: a substrate; a gate electrode on the substrate; an active layer on or below the gate electrode, the active layer at least partially overlapping the gate electrode and including a first active region and a second active region, the first active region and the second active region facing each other and extending beyond the gate electrode; a source electrode electrically connected to the first active region; and a drain electrode electrically connected to the second active region, wherein the active layer may include a plurality of sub-active layers extending from the source electrode to the drain electrode and spaced apart from each other. The gate electrode may be at least partially inserted into a space between the sub-active layers.

One or more embodiments may provide a method for fabricating a thin film transistor substrate, including: forming a gate electrode on a substrate; forming an active layer on or below the gate electrode to at least partially overlap the gate electrode, the active layer including a first active region and a second active region facing, the first active region and the second active region facing each other and extending beyond the gate electrode; electrically connecting a source electrode to the first active region; and electrically connecting a drain electrode to the second active region, wherein the active layer includes a recess region which is at least partially recessed from one surface of the active layer facing the gate electrode, and the recess region includes a portion extending between the first active region and the second active region. The recess region may include a through hole passing through the active layer. The method may further include forming a gate insulating film for insulation and protection of the gate electrode, wherein the gate electrode covers and surrounds a part of outer side surfaces of the active layer in non-contact with a line extending in a direction of the source electrode and the drain electrode, and the gate insulating film is interposed between the gate electrode and the active layer. The method further including removing a portion of the active layer to form a groove extending vertically within the active layer. The method further including forming a through-hole passing through the active layer.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

The embodiments will now be described more fully hereinafter with reference to the accompanying drawings, in which preferred embodiments are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Figure 1:
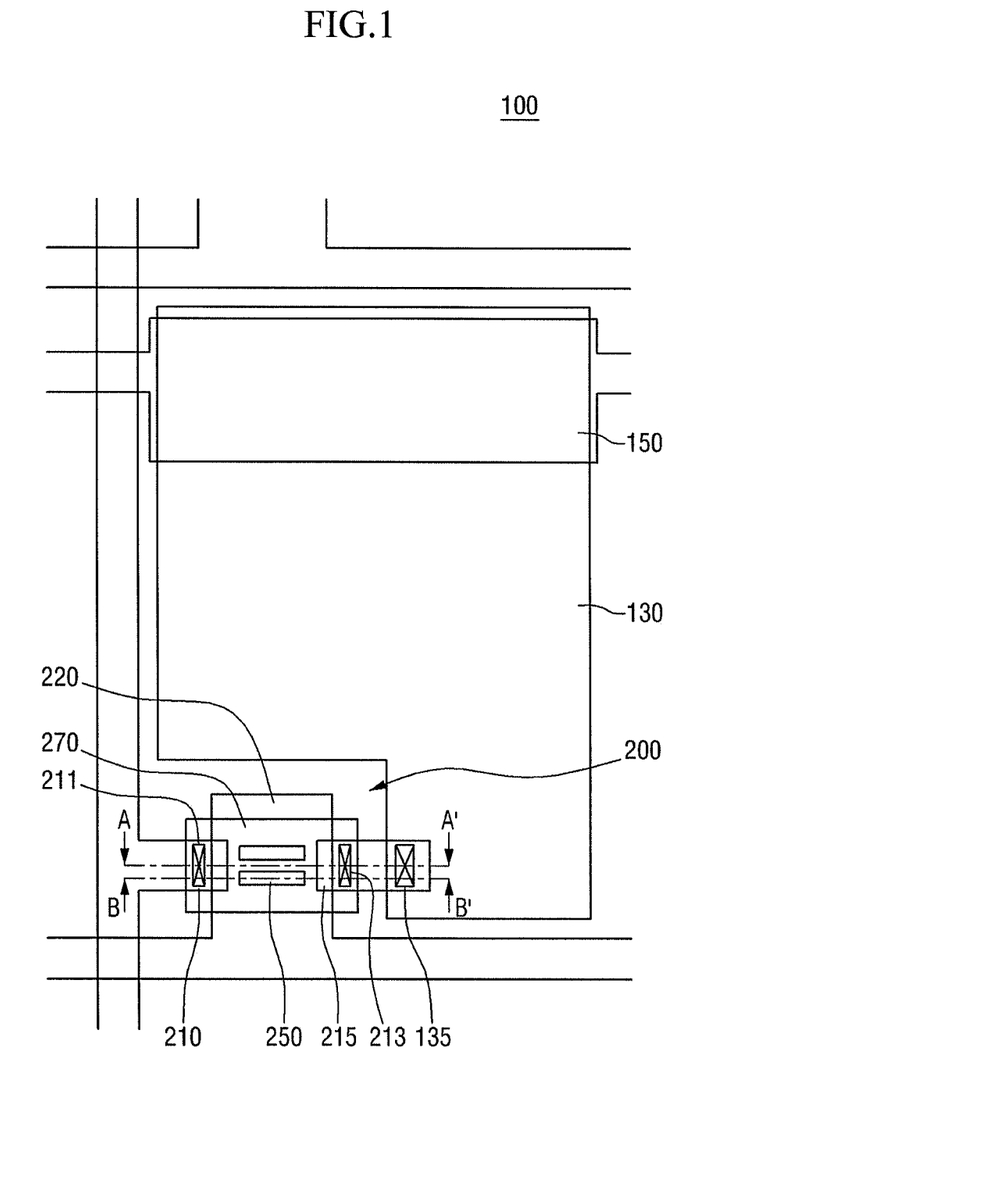
FIG. 1 illustrates a layout view of a thin film transistor substrate in accordance with an embodiment.
Figure 2:
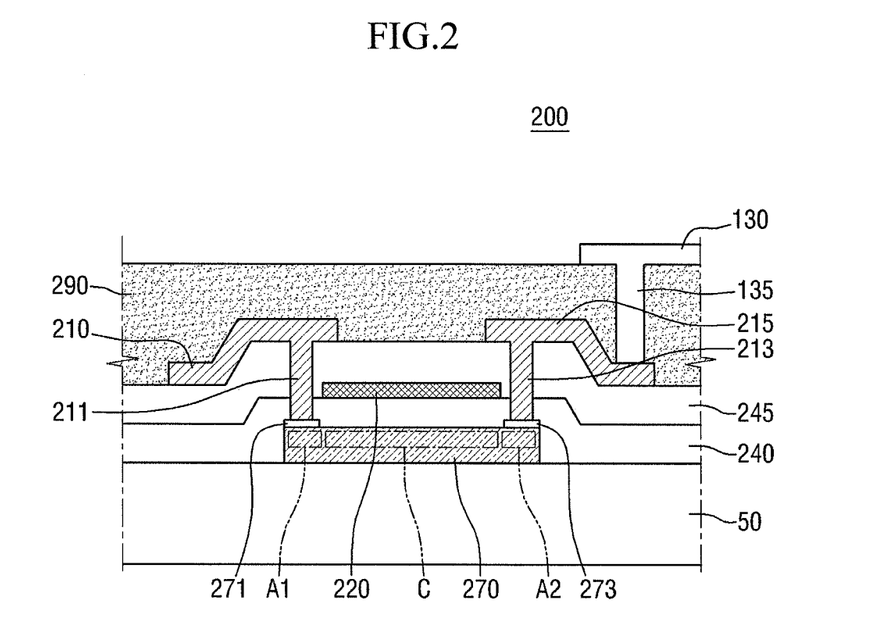
FIGS. 2 and 3 illustrate cross-sectional views taken along lines A-A' and B-B' of FIG. 1, respectively.
Figure 3:
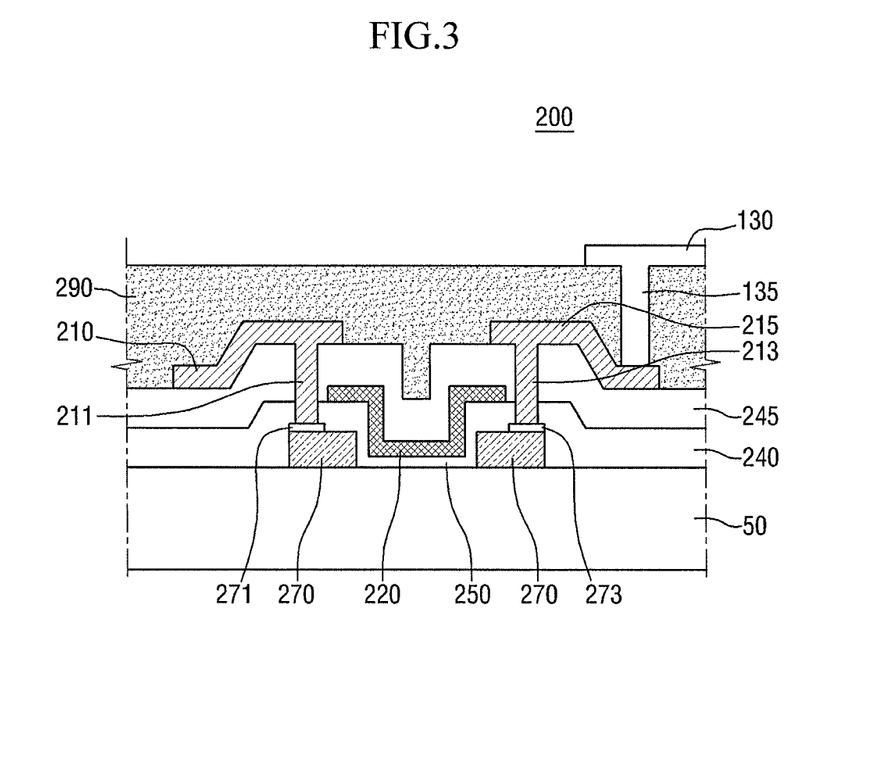
Figure 4:
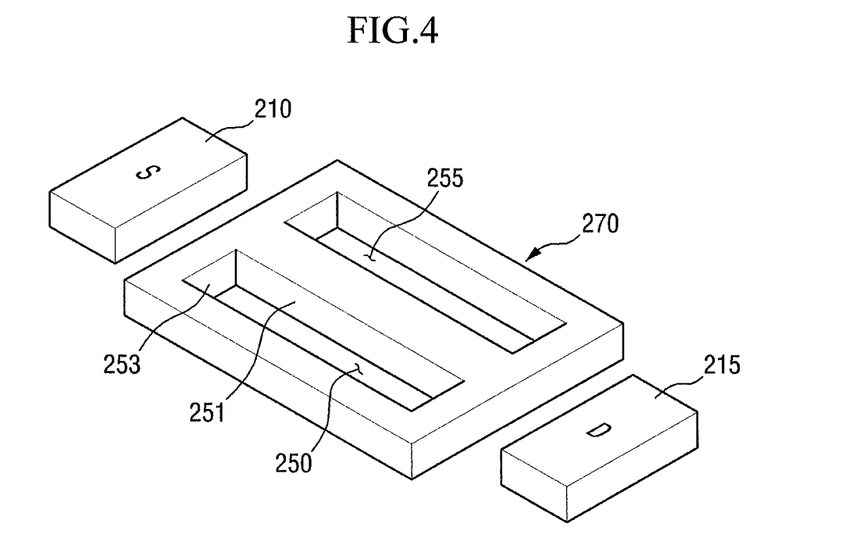
FIG. 4 illustrates a perspective view of an active layer that is a component of a thin film transistor disposed on the thin film transistor substrate in accordance with the embodiments.

FIG. 1 illustrates a layout view of a thin film transistor substrate in accordance with embodiments. FIGS. 2 and 3 illustrate cross-sectional views taken along lines A-A' and B-B' of FIG. 1, respectively. FIG. 4 illustrates a perspective view of an active layer that is a component of a thin film transistor disposed on the thin film transistor substrate in accordance with the embodiments.

Referring to FIGS. 1 to 4, a thin film transistor substrate 100 in accordance with the embodiments may include a substrate 50, a gate electrode 220, a gate insulating film 240, an interlayer insulating film 245, an active layer 270, a source electrode 210, and a drain electrode 215.

The substrate 50, on which components of a thin film transistor 200 may be arranged, may be formed of an insulating material, such as glass, and a transparent plastic having light permeability and corrosion resistance.

The gate electrode 220 may be a gate terminal of the thin film transistor 200, and may turn on/off the thin film transistor 200 serving as a switching device. If an ON voltage that is equal to or greater than a threshold voltage is applied to the gate electrode 220, an electric field may be formed such that free electrons in the active layer 270 move along the electric field toward the gate electrode 220, thereby forming a channel C in which current flows in the active layer 270.

On the other hand, if an OFF voltage is applied to the gate electrode 220, the channel C may vanish to cut off the current between the source electrode 210 and the drain electrode 215.

The gate insulating film 240 may be interposed between the gate electrode 220 and the active layer 270. In this embodiment, a top gate type thin film transistor is illustrated. Accordingly, a laminated structure may be formed in which the gate insulating film 240 is formed on the active layer 270, and the gate electrode 220 is formed on the gate insulating film 240.

The gate electrode 220 may include, for example, aluminum (Al), molybdenum (Mo), chromium (Cr), tantalum (Ta), titanium (Ti), tungsten (W), copper (Cu), silver (Ag) or an allow thereof, or may be formed of two or more metal layers having different physical properties.

Further, the interlayer insulating film 245 may be formed between the gate electrode 220 and the source and drain electrodes 210 and 215, thereby insulating them from each other.

The source electrode 210 and the drain electrode 215 may form a source terminal and a drain terminal of the thin film transistor 200, respectively. The source electrode 210 and the drain electrode 215 may be insulated from the gate electrode 220 by the interlayer insulating film 245 and spaced apart from each other to face each other around the gate electrode 220.

The source electrode 210 and the drain electrode 215 may be spaced apart from each other to face each other, and may be electrically connected to the active layer 270 through first and second contact holes 211 and 213 formed in the gate insulating film 240 and the interlayer insulating film 245.

Further, the source electrode 210 and the drain electrode 215 may include, for example, aluminum (Al), molybdenum (Mo), chromium (Cr), tantalum (Ta), titanium (Ti), tungsten (W), copper (Cu), silver (Ag), or an allow thereof, or may include two or more metal layers having different physical properties.

The active layer 270 may include a channel forming region C, which may provide a path in which free electrons move between the source electrode 210 and the drain electrode 215, a first active region A1 electrically connected to the source electrode 210, and a second active region A2 electrically connected to the drain electrode 215. The active layer 270 may at least partially overlap the gate electrode 220 while the gate insulating film 240 is interposed between the active layer 270 and the gate electrode 220.

The active layer 270 may include, for example, amorphous silicon (a-Si), but it is not limited thereto.

The active layer 270 may include a recess region which is at least partially recessed from one surface of the active layer 270 facing the gate electrode 220. The recess region may include a portion extending in a direction between the first active region A1 and the second active region A2. In some embodiments, the entire recess region may be formed to extend in the direction between the first active region A1 and the second active region A2.

The recess region may include through holes 250 and 255, recessed within and extending through the active layer 270 as shown in FIGS. 3 and 4. Although two rectangular through holes 250 and 255 may extend between the source electrode 210 and the drain electrode 215, as shown in FIG. 4, there is no limitation on the shape and the number of the through holes.

The through holes 250 and 255 may be formed in the active layer 270. As such, the gate electrode 220 may be inserted in the through holes 250 and 255. Accordingly, sidewalls 251 and 253 of the through holes 250 and 255, and a portion of the gate electrode 220 inserted in the through holes 250 and 255 may be positioned on the same horizontal level. For example, an upper surface of the active layer 270 may be in a first horizontal plane, and a lower surface of the active layer 270 may be in a second horizontal plane. The portion of the gate electrode 220 that extends within the through holes 250 and 255 may extend between the first horizontal plane and the second horizontal plane. As a result, the channel may be formed not only on the upper surface of the active layer 270, but also in the active layer 270, along the direction between the source electrode 210 and the drain electrode 215, so that the channel can be three-dimensionally formed in the active layer 270.

As described above, the channel may be three-dimensionally formed in the active layer 270. As such, the gate electrode 220 may cause a field effect to not only the upper surface of the active layer 270 along the direction between the source electrode 210 and the drain electrode 215, but also the sidewalls 251 and 253 of the through holes 250 and 255 formed in the active layer 270.

When, for example, the channel is extinguished by applying an OFF voltage to the gate electrode 220 to cut off the current between the source electrode 210 and the drain electrode 215, the OFF voltage applied to the gate electrode 220 may exert a three-dimensional influence on the active layer 270. Consequently, it is possible to reduce leakage current by applying an OFF voltage into the active layer 270. Further, since the through holes 250 and 255 may be formed in the active layer 270, it is possible to further reduce the leakage current by reducing an absolute space in which the leakage current can flow. By reducing the leakage current, the size of a storage capacitor 150 that will be described later may be reduced, thereby improving an opening ratio.

The through holes 250 and 255 may be formed in the active layer 270, as described above. As such, even if it is desired to maintain the amount of leakage current generated when the channel is formed only on portions of the upper surface of the active layer (through which the through holes do not extend), it is possible to reduce the OFF voltage applied to the gate electrode 220, thereby reducing power consumption.

The gate insulating film 240 may be formed on any one of the upper surface and the lower surface of the gate electrode 220 for insulation and protection of the gate electrode 220. According to an embodiment, as shown in FIG. 2, the gate insulating film 240 may be below the gate electrode 220. The gate insulating film 240 may include, for example, silicon nitride (SiNx) or silicon oxide (SiOx).

The interlayer insulating film 245 may be formed on the gate insulating film 240 to insulate the gate electrode 220 from the source electrode 210 and the drain electrode 215. Further, the interlayer insulating film 245 may include, for example, silicon nitride (SiNx) or silicon oxide (SiOx).

The thin film transistor substrate 100, in accordance with the embodiments, may further include resistive contact layers 271 and 273, a passivation film 290, a pixel electrode 130, and the storage capacitor 150.

The resistive contact layers 271 and 273 may reduce electric contact resistance between the source electrode 210 and the active layer 270 and between the drain electrode 215 and the active layer 270, thereby improving driving characteristics of the thin film transistor 200. In order to reduce electric contact resistance, the resistive contact layers 271 and 273 may be interposed between the source electrode 210 and the first active region A1 and between the drain electrode 215 and the second active region A2, respectively.

The resistive contact layers 271 and 273 may include, for example, amorphous silicon (n+a-Si) doped with n type impurities in high concentration.

The passivation film 290 may be formed on the thin film transistor 200 as an insulating film to protect and insulate the thin film transistor 200. The passivation film 290 may include, for example, silicon nitride (SiNx) or silicon oxide (SiOx).

The pixel electrode 130 may adjust the alignment of liquid crystal molecules (not shown) by adjusting an electric field between a color filter substrate (not shown) and a thin film transistor substrate with a common electrode (not shown) formed on the color filter substrate. The pixel electrode 130 may be electrically connected to the drain electrode 215 through a third contact hole 135 formed in the passivation film 290.

The pixel electrode 130 may be connected to the drain electrode 215. Thus, if an ON voltage is applied to the gate electrode 220, the thin film transistor 200 may be set in an ON state (conducting state) such that a data voltage may be transmitted to the pixel electrode 130 through the drain electrode 215. As a result, an electric field may be formed due to a potential difference between the pixel electrode 130 to which a data voltage is applied and the common electrode to which a common voltage is applied, thereby adjusting the alignment of the liquid crystal molecules.

The pixel electrode 130 may include a transparent conductive material, e.g., indium zinc oxide (IZO) or indium tin oxide (ITO).

The storage capacitor 150 may maintain a data voltage applied to the pixel electrode 130 for a predetermined period of time. The storage capacitor 150 may employ an adjacent gate electrode line or may be formed independently of the gate electrode, but it is not limited thereto.

Figure 5:
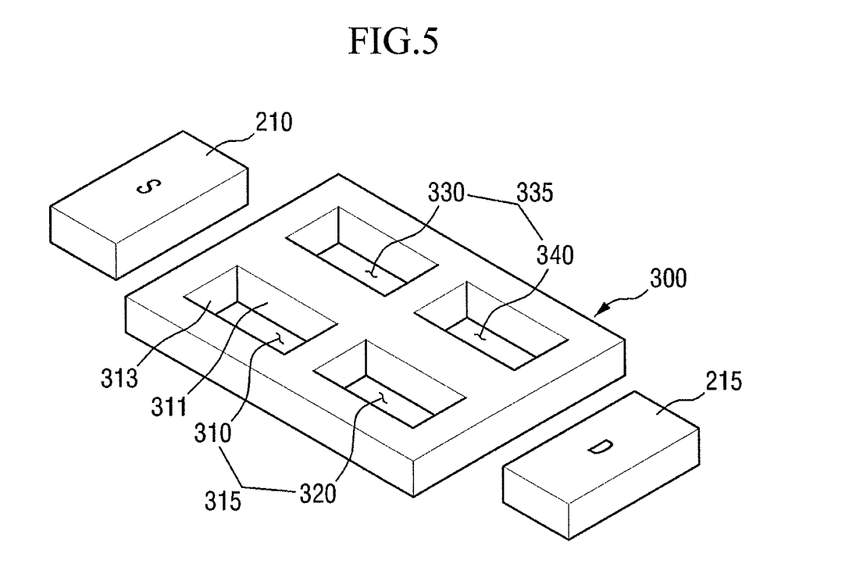
FIGS. 5 to 11 illustrate perspective views of an active layer as a component of a thin film transistor disposed on a thin film transistor substrate in accordance with various embodiments.

FIG. 5 illustrates a perspective view of an active layer as a component of a thin film transistor disposed on a thin film transistor substrate in accordance with other embodiments.

Referring to FIG. 5, the thin film transistor substrate in accordance with other embodiments may be different from the embodiment illustrated in FIG. 4 with respect to the structure and shape of the through holes formed in an active layer 300, as a component of the thin film transistor formed on the thin film transistor substrate.

Through holes 315 and 335 may be formed in the active layer 300. The through holes 315 and 335 may include two or more sub-through holes 310, 320 and sub-through-holes 330 and 340, respectively, extending in a line, e.g. in rows, from the source electrode 210 to the drain electrode 215. As shown in FIG. 5, two through holes 315 and 335 may be formed in the active layer 300 and each through hole may be partially blocked such that four sub-through holes 310, 320, 330 and 340 are formed in the active layer 300.

As described above, the through holes 315 and 335 may be formed in the active layer 300. As such, the gate electrode 220 may cause a field effect to not only the upper surface of the active layer 300, but also the sidewalls of the through hole (e.g., the sidewalls 311 and 313 of the through hole 315), so that the channel can be three-dimensionally formed over the entire region of the active layer 300. Accordingly, as described above, since there is no need to increase the OFF voltage, it is possible to reduce power consumption. By reducing the leakage current, the size of the storage capacitor 150 may be reduced, thereby improving an opening ratio. Further, since the channel may become long, it may be possible to prevent generation of the leakage current by preventing a short between the source electrode 210 and the drain electrode 215.

Figure 6:
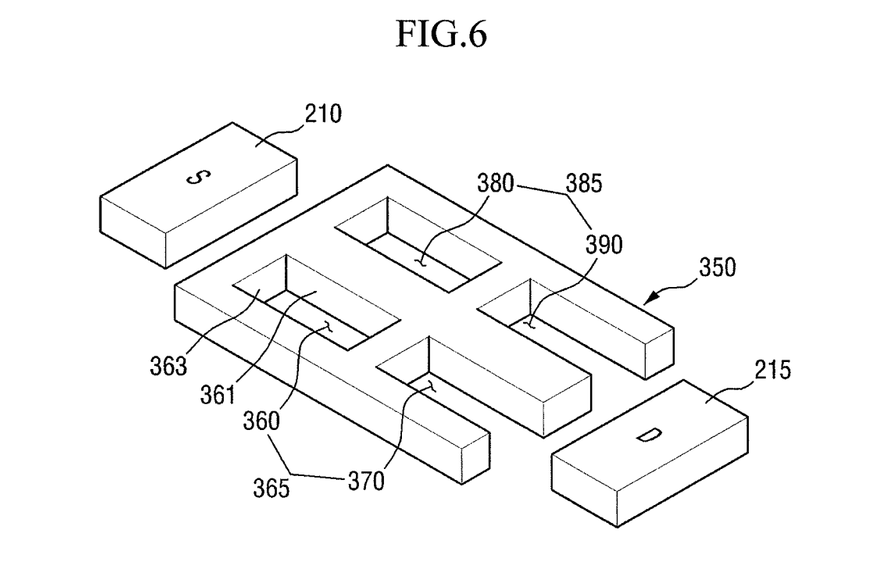
Figure 7:
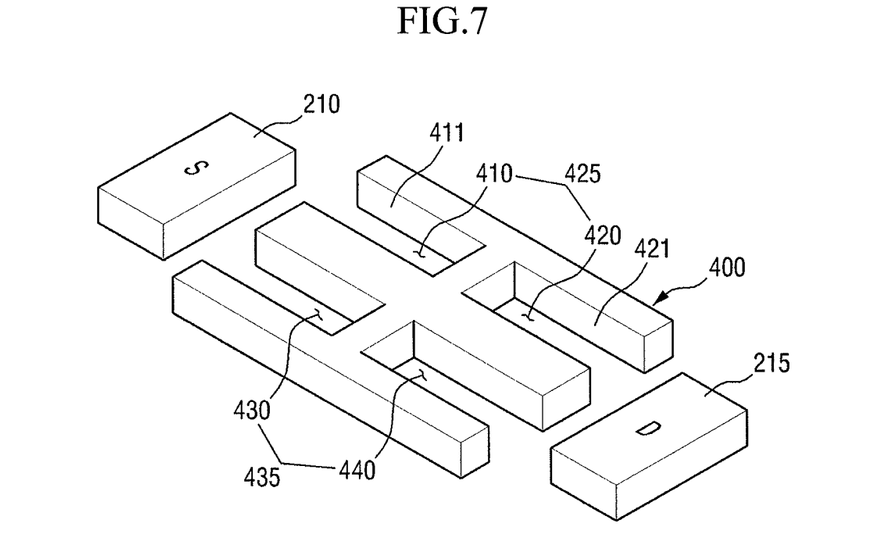

FIGS. 6 and 7 illustrate perspective views of an active layer as a component of a thin film transistor disposed on a thin film transistor substrate in accordance with still other embodiments.

Referring to FIGS. 6 and 7, the thin film transistor substrate in accordance with still other embodiments may be different from the above-described embodiments, with respect to the structure of the through holes formed in active layers 350 and 400 formed on the thin film transistor substrate.

Through holes 365 and 385, formed in an active layer 350, may include two or more sub-through holes 360, 370 and sub-through holes 380, 390, respectively, between the source electrode 210 and the drain electrode 215. At least one sub-through hole 370 and 390 may be at the outermost portion, e.g., edge portion, of the active layer 350, and may have one open end adjacent to the source electrode 210 or the drain electrode 215.

As shown in FIG. 6, two through holes 365 and 385 may be formed in the active layer 350, and each of the through holes 365 and 385 may be partially blocked such that four sub-through holes 360, 370, 380 and 390 are formed in the active layer 350. The sub-through holes 370 and 390, located at the outermost portion of the active layer 350, may be open to the outside.

Further, as shown in FIG. 7, according to some embodiments, sub-through holes 410, 420, 430 and 440 may all be formed at the outermost portion, e.g., edge portion, of the active layer 350, and may have open ends adjacent to the source electrode 210 or the drain electrode 215.

As described above, since the through holes are formed in the active layer, the gate electrode may cause a field effect to not only the upper surface of the active layer, but also the sidewalls of the through holes, so that the channel can be three-dimensionally formed over the entire region of the active layer. Accordingly, since there is no need to increase the OFF voltage, it is possible to reduce power consumption. Further, by reducing the leakage current, the size of the storage capacitor may be reduced, thereby improving an opening ratio. In addition the channel may become long. As such, it may be possible to prevent generation of the leakage current by preventing a short between the source electrode 210 and the drain electrode 215.

Figure 8:
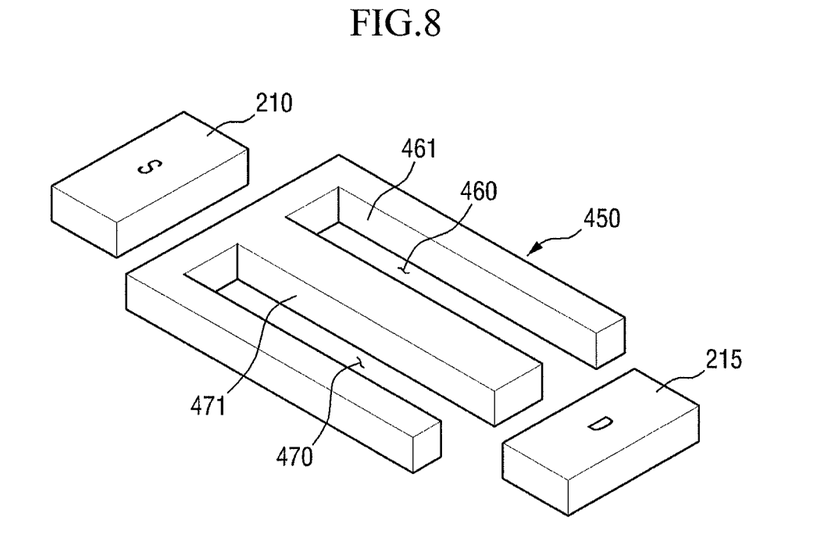

FIG. 8 illustrates a perspective view of an active layer as a component of a thin film transistor disposed on a thin film transistor substrate in accordance with still other embodiments.

Referring to FIG. 8, an active layer 450, in accordance with still other embodiments, may be different from the above-described embodiments with respect to the structure and shape of the through holes formed in the active layer 450.

As shown in FIG. 8, two through holes 460 and 470 may be formed in the active layer 450. According to some embodiments, any one of both ends of through holes 460 and 470, formed in the active layer 450, may be open. According to some embodiments, one end of each of the through holes 460 and 470 may be open to the outside.

As described above, the through holes 460 and 470 may be formed in the active layer 450. As such, the gate electrode 220 may cause a field effect to not only the upper surface of the active layer 450, but also sidewalls 461 and 471 of the through holes 460 and 470, so that the channel may be three-dimensionally formed in the active layer 450. Accordingly, there is no need to increase the OFF voltage. As such, it may be possible to reduce power consumption. Further, by reducing the leakage current, the size of the storage capacitor may be reduced, thereby improving an opening ratio.

Figure 9:
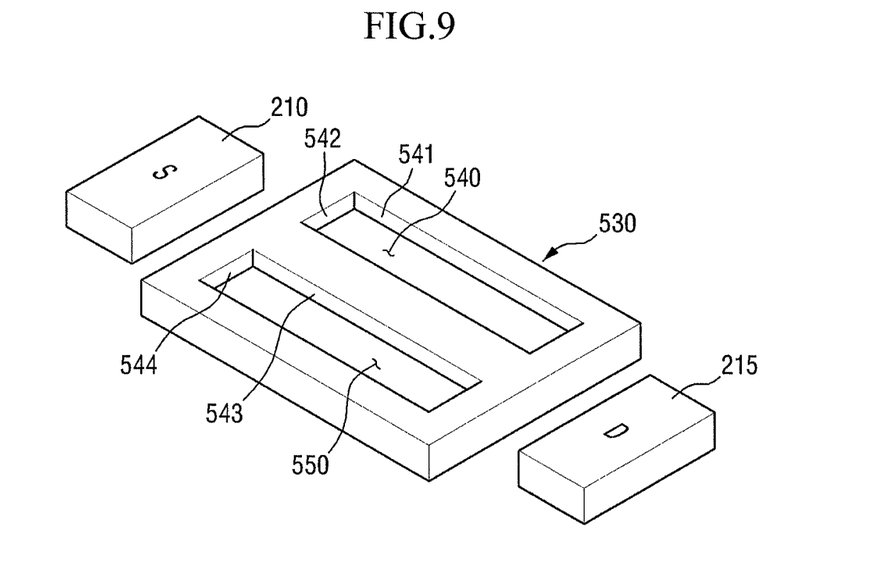

FIG. 9 illustrates a perspective view of an active layer as a component of a thin film transistor disposed on a thin film transistor substrate in accordance with still other embodiments.

Referring to FIG. 9, a thin film transistor substrate in accordance with still other embodiments may be different from the above-described embodiments with respect to the recess region formed in the active layer of the thin film transistor substrate. For example, the recessed region may include only partially recessed portions, or grooves 540 and 550, in which only a portion of the active layer is recessed.

An active layer 530 may include grooves 540 and 550, i.e., partially recessed portions of the active layer 530, extending in the direction between the first active region and the second active region. Further, the grooves 540 and 550 may include sidewalls 541, 542 and sidewalls 543, 544, respectively, extending from the upper surface of the active layer 530 toward the substrate 50.

As described above, the grooves 540 and 550 may be formed in the active layer 530. As such, the gate electrode 220 may be inserted into the grooves 540 and 550. As a result, the sidewalls 541, 542 and sidewalls 543, 544 of the grooves 540 and 550 may overlap a portion of the gate electrode 220 in a horizontal direction.

As described above, since the grooves 540 and 550 may be formed in the active layer 530, the gate electrode 220 may cause a field effect to not only the upper surface of the active layer 530, but also the sidewalls 541, 542, 543 and 544 of the grooves 540 and 550, so that the channel may be three-dimensionally formed in the active layer 530.

Accordingly, since there is no need to increase the OFF voltage, it is possible to reduce power consumption. Further, by reducing the leakage current, the size of the storage capacitor may be reduced, thereby improving an opening ratio.

Figure 10:
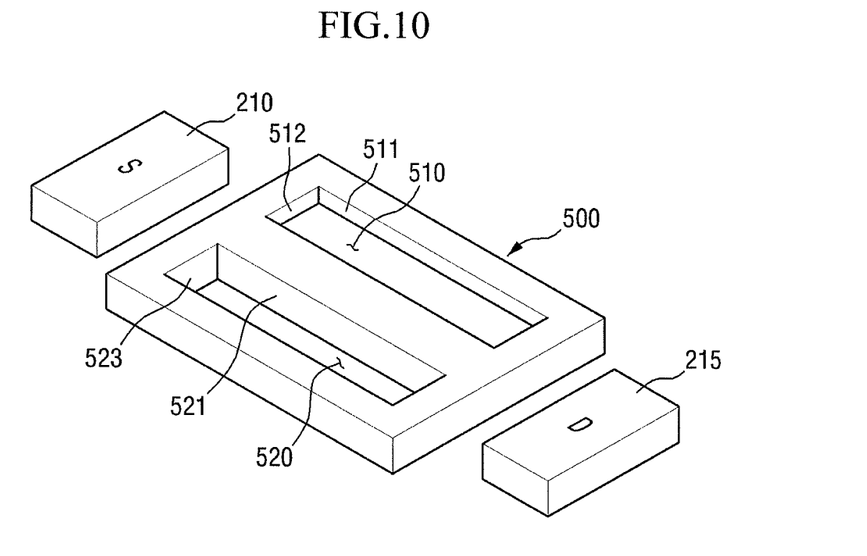

FIG. 10 illustrates a perspective view of an active layer as a component of a thin film transistor disposed on a thin film transistor substrate in accordance with still other embodiments.

Referring to FIG. 10, a thin film transistor substrate in accordance with still other embodiments may be different from the above-described embodiments with respect to a through hole 520 and a groove 510 formed in an active layer 500 on the thin film transistor substrate.

The active layer 500 may include a groove 510, a partially recessed portion, extending in the direction between the first active region and the second active region. The groove 510 may include sidewalls 511 and 542 extending from the upper surface of the active layer 500 toward the substrate 50. In addition to the groove 510, the active layer 500 may include a through hole 520, extending through the active layer 500.

As described above, since the groove 510 and the through hole 520 may be formed in the active layer 500, the gate electrode 220 may be inserted into the groove 510 and the through hole 520. As a result, the sidewalls 511, 512, 521 and 523 of the groove 510 and the through hole 520 may overlap a portion of the gate electrode 220 in a horizontal direction.

As described above, the groove 510 and the through hole 520 may be formed in the active layer 500. As such, the gate electrode 220 may cause a field effect to not only the upper surface of the active layer 500, but also the sidewalls 511, 512, 521 and 523 of the groove 510 and the through hole 520, so that the channel may be three-dimensionally formed in the active layer 500.

Accordingly, since there is no need to increase the OFF voltage, it is possible to reduce power consumption. Further, by reducing the leakage current, the size of the storage capacitor may be reduced, thereby improving an opening ratio.

Figure 11:
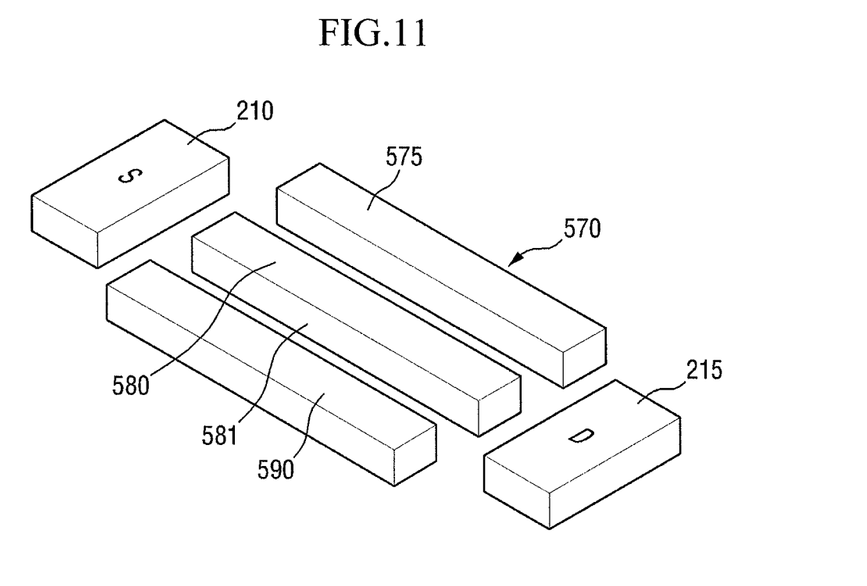

FIG. 11 illustrates a perspective view of an active layer as a component of a thin film transistor disposed on a thin film transistor substrate in accordance with still other embodiments.

Referring to FIG. 11, a thin film transistor substrate in accordance with still other embodiments may be different from the above-described embodiments with respect to an active layer 570 formed on the thin film transistor substrate, which may include sub-active layers 575, 580 and 590.

The active layer 570 may include a plurality of sub-active layers 575, 580 and 590, spaced apart from one another in a portion extending in the direction between the first active region and the second active region. As shown in FIG. 11, the active layer 570 may include three sub-active layers 575, 580 and 590, and the gate electrode 220 may be inserted between the sub-active layers 575, 580 and 590, spaced apart from one another, to cause a field effect to not only the upper surfaces of the sub-active layers 575, 580 and 590, but also a sidewall 581 of the sub-active layers 575, 580 and 590.

As described above, the active layer 570 may include a plurality of sub-active layers 575, 580 and 590. As such, the gate electrode 220 may cause a field effect to not only the only the upper surfaces of the sub-active layers 575, 580 and 590, but also the sidewall 581 of the sub-active layers 575, 580 and 590, so that the channel may be three-dimensionally formed in the active layer 570.

Accordingly, since there is no need to increase the OFF voltage, it is possible to reduce power consumption. Further, by reducing the leakage current, the size of the storage capacitor may be reduced, thereby improving an opening ratio.

Hereinafter, a bottom gate type thin film transistor in which a gate electrode is formed below an active layer will be described with reference to FIG. 12. For convenience of explanation, a repeated description of components identical to the embodiments described above will be omitted.

Figure 12:
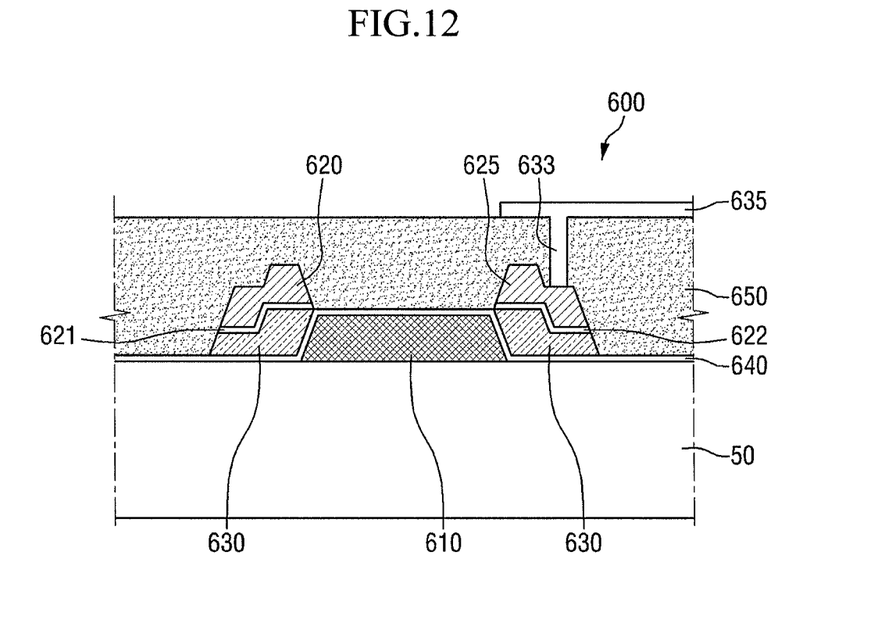
FIG. 12 illustrates a cross-sectional view of a thin film transistor substrate in accordance with another embodiment.

FIG. 12 illustrates a cross-sectional view of a thin film transistor substrate in accordance with other embodiments.

Referring to FIG. 12, the thin film transistor substrate, in accordance with still other embodiments, may include a bottom gate type thin film transistor formed on the thin film transistor substrate in which a gate electrode is formed below an active layer, unlike the embodiments illustrated in FIGS. 1 to 4. However, features of the above-described embodiments, e.g., a recess region formed in the active layer that is at least partially recessed, may be included in the embodiment shown in FIG. 12, described below.

As shown in FIG. 12, a gate electrode 610 may be disposed on the substrate 50 and a gate insulating film 640 may be disposed on the gate electrode 610. An active layer 630 may include at least one of through holes, grooves and sub-active layers and may be formed on the gate insulating film 640. A source electrode 620 and a drain electrode 625 may be formed on the active layer 630, while resistive contact layers 621 and 622 may be interposed therebetween.

Further, a passivation film 650 may be formed on the source electrode 620 and the drain electrode 625, and a contact hole 633 may be formed in the passivation film 650. Then, a pixel electrode 635 may be electrically connected to the drain electrode 625.

As described above, since a recess region which is at least partially recessed may be formed in the active layer 630, the gate electrode 610 may be inserted into a space formed in the active layer 630, and cause a field effect to not only the lower surface of the active layer 630, but also the inside of the active layer 630, so that the channel may be three-dimensionally formed in the active layer 630.

Accordingly, since there is no need to increase the OFF voltage, it is possible to reduce power consumption. Further, by reducing the leakage current, the size of the storage capacitor may be reduced, thereby improving an opening ratio.

Hereinafter, a thin film transistor in which a gate electrode surrounds a side surface of an active layer will be described with reference to FIGS. 13 and 14. For convenience of explanation, a repeated description of components identical to those of the embodiments described above will be omitted.

Figure 13:
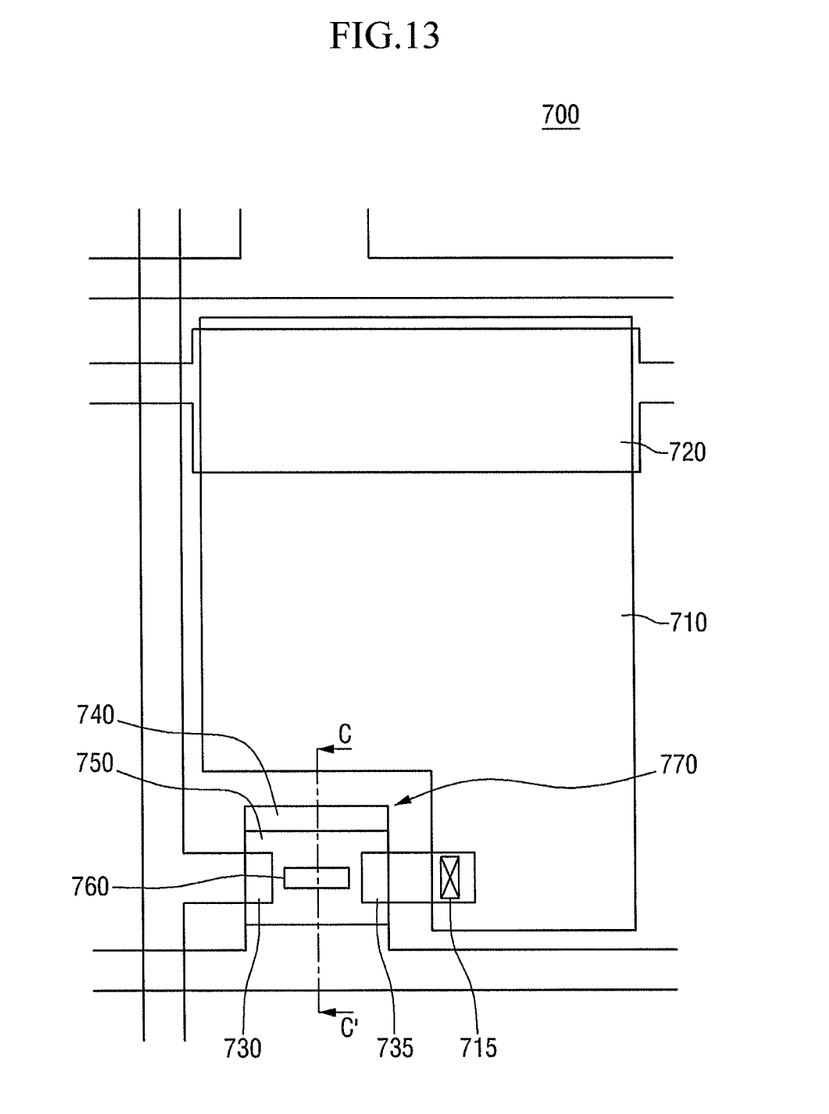
FIG. 13 illustrates a layout view of a thin film transistor substrate in accordance with still other embodiments.

FIG. 13 illustrates a layout view of a thin film transistor substrate in accordance with still other embodiments. FIG. 14 illustrates a cross-sectional view taken along line C-C' of FIG. 13 in accordance with still other embodiments.

Figure 14:
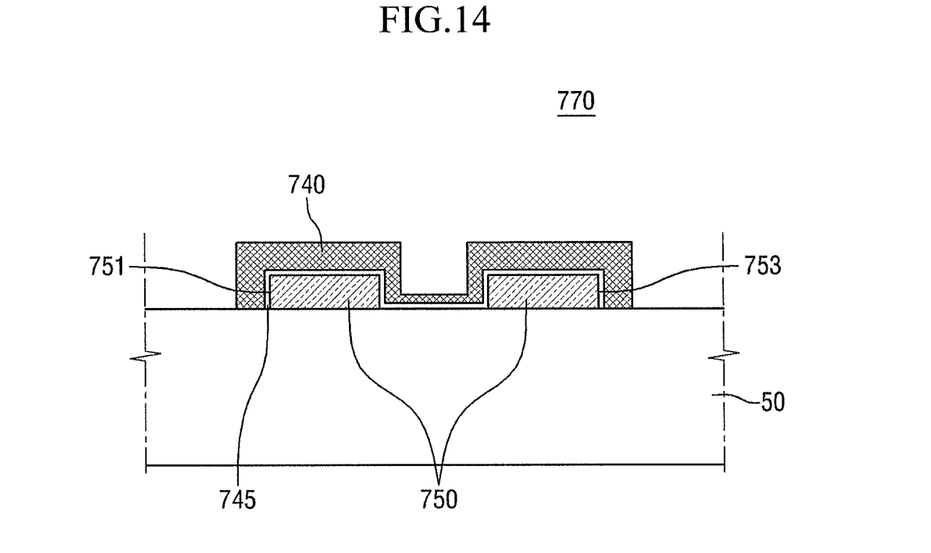
FIG. 14 illustrates a cross-sectional view taken along line C-C' of FIG. 13 in accordance with still other embodiments.

Referring to FIGS. 13 and 14, a gate electrode 740 may cover an active layer 750 while a gate insulating film 745 may be interposed therebetween to surround not only the upper surface of the active layer 750, but also outer side surfaces 751 and 753 of the active layer 750. More specifically, the gate electrode may cover a portion of the outer side surfaces of the active layer in a direction perpendicular to the direction of the source electrode and the drain electrode.

As described above, since the active layer 750 may be surrounded by the gate electrode 740, the gate electrode 740 may cause a field effect even to the outer surfaces 751 and 753 of the active layer 750, so that the channel may be three-dimensionally formed in the active layer 750.

Accordingly, since there is no need to increase the OFF voltage, it is possible to reduce power consumption. Further, by reducing the leakage current, the size of the storage capacitor may be reduced, thereby improving an opening ratio.

Figure 15:
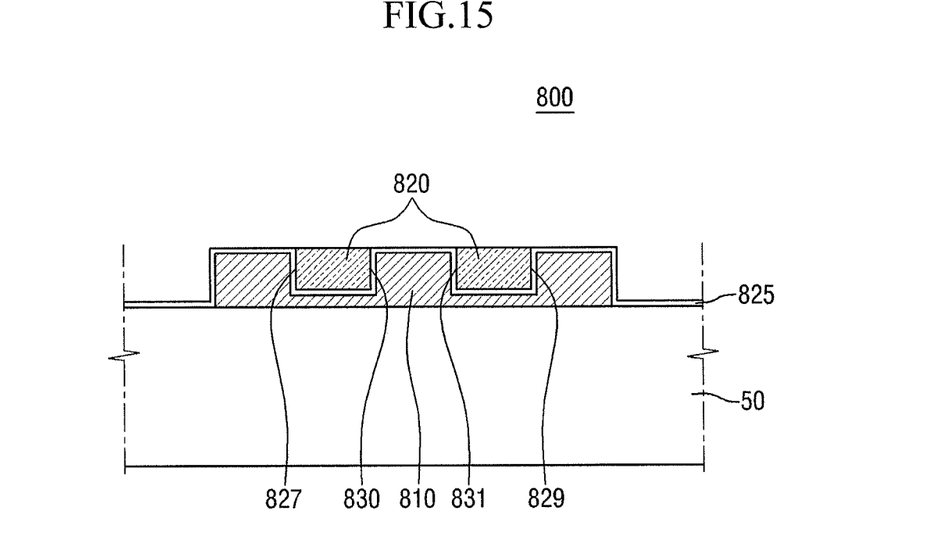
FIG. 15 illustrates a cross-sectional view of a thin film transistor substrate in accordance with still other embodiments.

FIG. 15 illustrates a cross-sectional view of a thin film transistor substrate in accordance with still other embodiments, which shows a cross-sectional view of a thin film transistor taken along a direction perpendicular to the direction of the source electrode and the drain electrode formed on the substrate.

Referring to FIG. 15, the thin film transistor substrate, in accordance with still other embodiments, may include a bottom gate type thin film transistor in which a gate electrode 810 is formed below an active layer 820, and through holes is formed in the active layer 820. However, not only the through holes but also various recess regions such as grooves may be formed in the active layer.

The gate electrode 810 may cover and surround outer side surfaces 827 and 829 of the active layer, that are not in contact with a line extending in the direction of the source electrode and the drain electrode. A gate insulating film 825 may be interposed between the outer side surfaces 827 and 829 of the active layer 820 and the gate electrode 810.

As described above, the gate electrode 810 not only forms an electric field at sidewalls 830 and 831 of the through holes formed in the active layer 820, but also surrounds the outer side surfaces 827 and 829 of the active layer 820. As such, the channel can be three-dimensionally formed in the active layer 820, thereby reducing the leakage current and power consumption.

Hereinafter, a method for fabricating a thin film transistor substrate shown in

FIGS. 1 to 4 in accordance with the embodiments will be described with reference to FIGS. 3 and 16 to 20. For convenience of explanation, a repeated description of the embodiments will be omitted.

Figure 16:
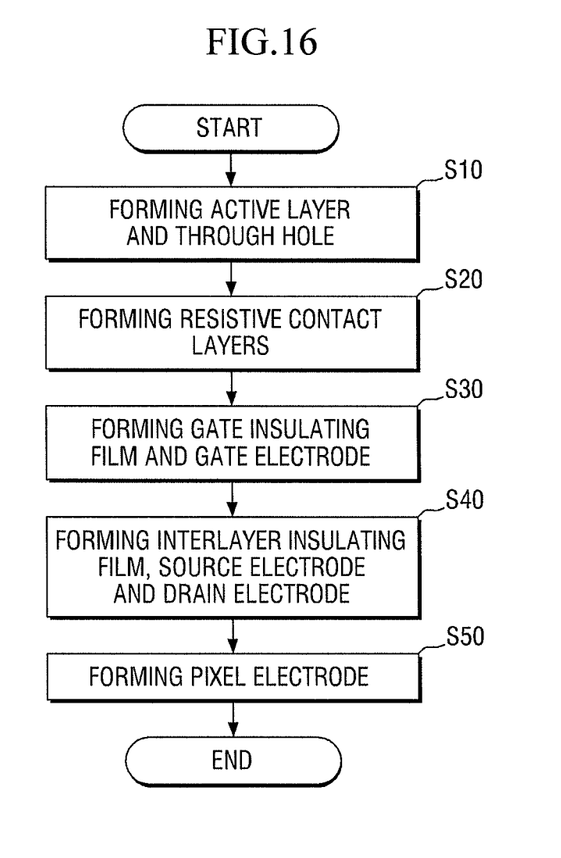
FIG. 16 illustrates a flowchart of a method for fabricating a thin film transistor substrate in accordance with the embodiments.

FIG. 16 illustrates a flowchart of a method for fabricating a thin film transistor substrate in accordance with the embodiments. FIGS. 17 to 20 illustrate cross-sectional views of intermediate steps of the method for fabricating a thin film transistor substrate in accordance with the embodiments.

Figure 17:
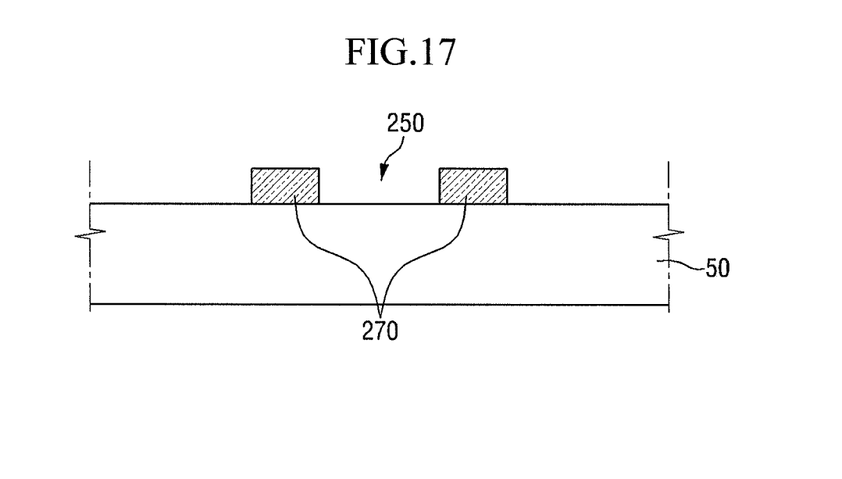
FIGS. 17 to 20 illustrate cross-sectional views of intermediate steps of the method for fabricating a thin film transistor substrate in accordance with the embodiments.

Referring to FIGS. 16 and 17, the active layer 270 may be formed and the through hole 250 may be formed in the active layer 270 (S 10). Specifically, amorphous silicon (a-Si) for the active layer 270 may be deposited on the substrate 50 and patterned to form the active layer 270 having the through hole 250.

Figure 18:
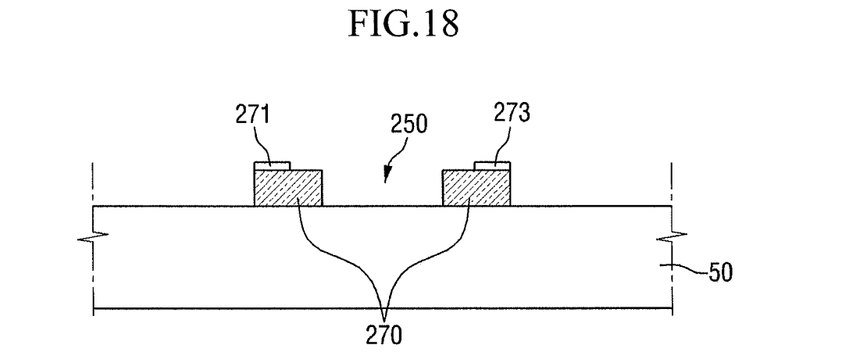

Referring to FIGS. 16 and 18, the resistive contact layers 271 and 273 may be formed on the active layer 270 (S20). For example, amorphous silicon (n+a-Si) doped with n+ ions in high concentration may be deposited on the active layer 270 and patterned to form the resistive contact layers 271 and 273.

Figure 19:
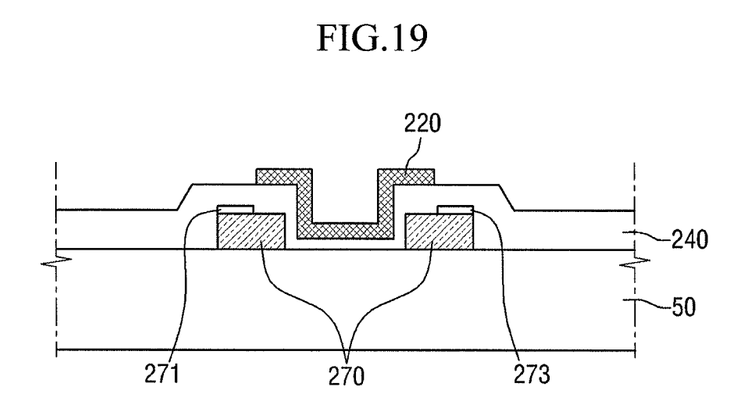

Referring to FIGS. 16 and 19, the gate insulating film 240 and the gate electrode 220 may be formed (S30). Specifically, the gate insulating film 240 and a conductive layer may be deposited on the entire surface of the substrate 50, and then the conductive layer may be selectively patterned to form the gate electrode 220.

Figure 20:
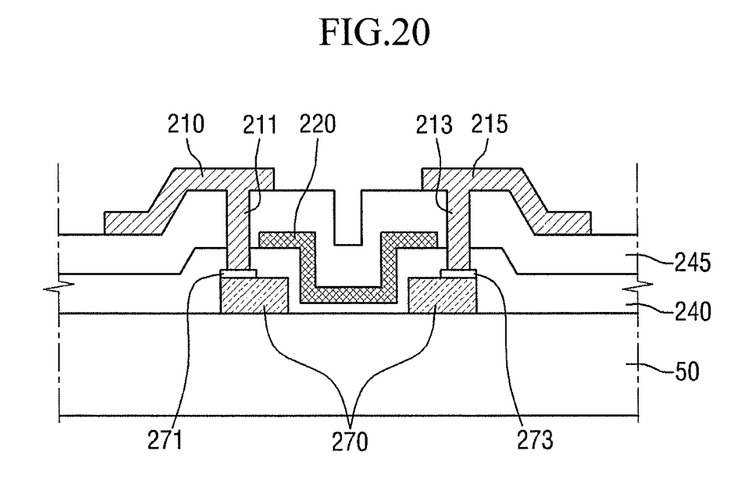

Referring to FIGS. 16 and 20, the source electrode 210 and the drain electrode 215 may be formed (S40). Specifically, the interlayer insulating film 245 may be deposited on the entire surface of the substrate 50 and then patterned to form first and second contact holes 211 and 213 in the gate insulating film 240 and the interlayer insulating film 245. Then, a conductive layer may be deposited on the substrate and patterned to form the source electrode 210 and the drain electrode 215 connected to the resistive contact layers 271 and 273 through the first and second contact holes 211 and 213.

Referring to FIGS. 16 and 3, the passivation film 290 and the pixel electrode 130 may be formed (S50). Specifically, the passivation film 290 may be deposited on the entire surface of the substrate 50 and patterned to form the third contact hole 135 exposing a portion of the drain electrode 215. Then, a conductive layer may be deposited on the entire surface of the substrate 50 on which the passivation film 290 is formed, and patterned to form the pixel electrode 130 connected to the drain electrode 215 through the third contact hole 135, thereby completing the thin film transistor substrate as shown in FIG. 3.

One or more embodiments may provide a thin film transistor substrate capable of reducing leakage current and a method for fabricating the same.

While the embodiments have been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A thin film transistor substrate, comprising:
    a substrate;
    a gate electrode on the substrate;
    an active layer formed on or below the gate electrode, at least partially overlapping the gate electrode, the active layer including a first active region and a second active region, the first active region and the second active region facing each other and extending beyond the gate electrode;
    a source electrode electrically connected to the first active region; and
    a drain electrode electrically connected to the second active region, wherein the active layer includes at least one recess region which is at least partially recessed from a surface of the active layer facing the gate electrode, and the recess region includes a portion extending between the first active region and the second active region, and wherein the recess region includes a through hole passing through the active layer.

2. The thin film transistor substrate of claim 1, wherein the through hole has one open end adjacent to the source electrode or the drain electrode.

3. The thin film transistor substrate of claim 1, wherein the recess region includes a groove extending vertically within the active layer.

4. The thin film transistor substrate of claim 1, wherein the recess region also includes a groove extending vertically within the active layer.

5. The thin film transistor substrate of claim 1, wherein the gate electrode is at least partially inserted into the recess region.

6. The thin film transistor substrate of claim 1, wherein the gate electrode is formed on the active layer.

7. The thin film transistor substrate of claim 1, wherein the gate electrode is formed below the active layer.

8. The thin film transistor substrate of claim 1, wherein the through hole includes two or more sub-through holes, formed by partially blocking an inner portion of through hole.

9. The thin film transistor substrate of claim 8, wherein at least one of the two or more sub-through holes is at an outermost portion of the active layer and includes an open end adjacent to the source electrode or the drain electrode.

10. The thin film transistor substrate of claim 9, wherein all of the sub-through holes are located at the outermost portion and have open ends adjacent to the source electrode or the drain electrode.

11. A thin film transistor substrate comprising:
    a substrate;
    a gate electrode on the substrate;
    an active layer formed on or below the gate electrode, at least partially overlapping the gate electrode, the active layer including a first active region and a second active region, the first active region and the second active region facing each other and extending beyond the gate electrode;
    a source electrode electrically connected to the first active region;
    a drain electrode electrically connected to the second active region, wherein the active layer includes at least one recess region which is at least partially recessed from a surface of the active layer facing the gate electrode, and the recess region includes a portion extending between the first active region and the second active region; and
    a gate insulating film for insulation and protection of the gate electrode,
    wherein the gate electrode is formed on an upper surface of the active layer,
    wherein the gate electrode covers and surrounds a part of outer side surfaces of the active layer is not in contact with a line extending in a direction of the source electrode and the drain electrode, and the gate insulating film is interposed between the gate electrode and the active layer, and wherein the part of outer side surfaces of the active layer is substantially vertical relative to a upper surface of the substrate and is not disposed in the recess region.

12. A thin film transistor substrate comprising:

a substrate;

a gate electrode on the substrate;

an active layer formed on or below the gate electrode, at least partially overlapping the gate electrode, the active layer including a first active region and a second active region, the first active region and the second active region facing each other and extending beyond the gate electrode;

a source electrode electrically connected to the first active region;

a drain electrode electrically connected to the second active region, wherein the active layer includes at least one recess region which is at least partially recessed from a surface of the active layer facing the gate electrode, and the recess region includes a portion extending between the first active region and the second active region; and a gate insulating film for insulation and protection of the gate electrode, wherein the gate electrode is formed below an upper surface of the active layer, and wherein the gate electrode covers and surrounds a part of outer side surfaces of the active layer is not in contact with a line extending in a direction of the source electrode and the drain electrode, and the gate insulating film is interposed between the gate electrode and the active layer.

13. A thin film transistor substrate, comprising:

a substrate;

a gate electrode on the substrate;

an active layer on or below the gate electrode, the active layer at least partially overlapping the gate electrode and including a first active region and a second active region, the first active region and the second active region facing each other and extending beyond the gate electrode;

a source electrode electrically connected to the first active region; and a drain electrode electrically connected to the second active region, wherein the active layer includes a plurality of sub-active layers extending from the source electrode to the drain electrode and spaced apart from each other.

14. The thin film transistor substrate of claim 13, wherein the gate electrode is at least partially inserted into a space between the sub-active layers.

15. A method for fabricating a thin film transistor substrate, the method comprising:

forming a gate electrode on a substrate;

forming an active layer on or below the gate electrode to at least partially overlap the gate electrode, the active layer including a first active region and a second active region facing, the first active region and the second active region facing each other and extending beyond the gate electrode;

electrically connecting a source electrode to the first active region; and electrically connecting a drain electrode to the second active region, wherein the active layer includes a recess region which is at least partially recessed from one surface of the active layer facing the gate electrode, and the recess region includes a portion extending between the first active region and the second active region, wherein the recess region includes a through hole passing through the active layer.

16. The method of claim 15, further comprising:

removing a portion of the active layer to form a groove extending vertically within the active layer.

17. A method for fabricating a thin film transistor substrate, the method comprising:

forming a gate electrode on a substrate;

forming an active layer on or below the gate electrode to at least partially overlap the gate electrode, the active layer including a first active region and a second active region facing, the first active region and the second active region facing each other and extending beyond the gate electrode;

electrically connecting a source electrode to the first active region; and electrically connecting a drain electrode to the second active region, wherein the active layer includes a recess region which is at least partially recessed from one surface of the active layer facing the gate electrode, and the recess region includes a portion extending between the first active region and the second active region;

forming a gate insulating film for insulation and protection of the gate electrode, wherein the gate electrode covers and surrounds a part of outer side surfaces of the active layer is not in contact with a line extending in a direction of the source electrode and the drain electrode, and the gate insulating film is interposed between the gate electrode and the active layer, and wherein the part of outer side surfaces of the active layer is substantially vertical relative to a upper surface of the substrate and is not disposed in the recess region.

* * * * *